(12) United States Patent
Hwang

(10) Patent No.: US 9,622,390 B2
(45) Date of Patent: Apr. 11, 2017

(54) APPARATUS FOR COOLING INVERTER

(71) Applicant: LSIS CO., LTD., Anyang-si, Gyeonggi-do (KR)

(72) Inventor: Soo Yong Hwang, Yongin-si (KR)

(73) Assignee: LSIS CO., LTD., Anyang-si (KR)

( * ) Notice: Subject to any disclaimer, the term of this patent is extended or adjusted under 35 U.S.C. 154(b) by 32 days.

(21) Appl. No.: 14/464,525

(22) Filed: Aug. 20, 2014

(65) Prior Publication Data
US 2015/0062812 A1 Mar. 5, 2015

(30) Foreign Application Priority Data

Aug. 30, 2013 (KR) .................. 10-2013-0103758

(51) Int. Cl.
*H05K 7/20* (2006.01)
*H01L 23/467* (2006.01)
*H02M 7/00* (2006.01)

(52) U.S. Cl.
CPC ....... *H05K 7/20909* (2013.01); *H01L 23/467* (2013.01); *H05K 7/20009* (2013.01); *H01L 2924/0002* (2013.01); *H02M 7/003* (2013.01)

(58) Field of Classification Search
CPC ............ H05K 7/20909; H05K 7/20009; H01L 23/467; H01L 2924/0002
USPC .................................................. 361/695, 692
See application file for complete search history.

(56) References Cited

U.S. PATENT DOCUMENTS

| 5,000,085 | A | * | 3/1991 | Archer | ................ | A47J 37/0623 |
| | | | | | | 126/21 A |
| 7,848,101 | B2 | * | 12/2010 | Dey | ........................ | G06F 1/20 |
| | | | | | | 312/236 |
| 8,619,424 | B2 | * | 12/2013 | Kishimoto | ......... | H05K 7/20909 |
| | | | | | | 165/104.33 |
| 9,192,079 | B2 | * | 11/2015 | Loth | .................. | H05K 7/20918 |
| 2006/0120043 | A1 | | 6/2006 | Wolford et al. | | |
| 2007/0230119 | A1 | * | 10/2007 | Baldwin, Jr. | ...... | H05K 7/20563 |
| | | | | | | 361/690 |
| 2010/0079944 | A1 | | 4/2010 | Loth | | |

FOREIGN PATENT DOCUMENTS

| CN | 102404979 | 4/2012 |
| CN | 202978741 | 6/2013 |
| EP | 0673066 | 9/1995 |
| EP | 2429275 | 3/2012 |
| GB | 2369249 | 5/2002 |
| JP | 60-37294 | 3/1985 |
| JP | 01-273395 | 11/1989 |

(Continued)

OTHER PUBLICATIONS

European Patent Office Application Serial No. 14181783.3, Search Report dated May 20, 2015, 9 pages.

(Continued)

*Primary Examiner* — Dion R Ferguson
*Assistant Examiner* — Mandeep S Buttar
(74) *Attorney, Agent, or Firm* — Lee, Hong, Degerman, Kang & Waimey

(57) ABSTRACT

An apparatus for cooling inverter is disclosed, whereby an optimum heat radiation effect can be accomplished, because a flow part is divided in response to heat generation amount of an electric element arranged inside a housing to adjust an air flow.

13 Claims, 4 Drawing Sheets

(56) References Cited

FOREIGN PATENT DOCUMENTS

| JP | 11-97872 | 4/1999 |
|---|---|---|
| JP | 2000-232792 | 8/2000 |
| JP | 2001-025254 | 1/2001 |
| JP | 2004-088023 | 3/2004 |
| JP | 2005-348533 | 12/2005 |
| JP | 2012-009636 | 1/2012 |
| JP | 2012-023799 | 2/2012 |
| JP | 2012-164939 | 8/2012 |
| JP | 5225759 | 3/2013 |
| JP | 5148238 | 7/2013 |

OTHER PUBLICATIONS

Korean Intellectual Property Office Application Serial No. 10-2013-0103758, Office Action dated Jan. 14, 2015, 4 pages.
Korean Intellectual Property Office Application Serial No. 10-2013-0103758, Office Action dated Jul. 9, 2014, 4 pages.
Japan Patent Office Application Serial No. 2014-174744, Office Action dated Nov. 10, 2015, 5 pages.
European Patent Office Application Serial No. 14181783.3, Office Action dated May 31, 2016, 7 pages.
The State Intellectual Property Office of the People's Republic of China Application Serial No. 201410438072.4, Office Action dated Jun. 3, 2016, 7 pages.

\* cited by examiner

APPARATUS FOR COOLING INVERTER

CROSS-REFERENCE TO RELATED APPLICATIONS

Pursuant to 35 U.S.C. §119(a), this application claims the benefit of earlier filing date and right of priority to Korean Patent Application No. 10-2013-0103758, filed on Aug. 30, 2013, the contents of which are all hereby incorporated by reference herein in its entirety.

BACKGROUND OF THE DISCLOSURE

Field of Endeavor

The present disclosure relates to an apparatus for cooling an inverter.

Background

In general, an inverter, or a power inverter, is an electrical power converter that changes DC (Direct Current) to AC (Alternating Current) at any required voltage and frequency for controlling an induction motor, but the inverter has problems of requiring a relatively large fan and a heat radiating member for forcibly discharging heat generated from elements inside the inverter, thereby increasing the size of the inverter. Conventionally, an inverter cooling structure is such that an inlet and an outlet are parallel arranged to cool semiconductor devices, whereby an eddy current is generated due to separation of space at the inlet before air influence reaches the elements whereby heat radiation effect decreases.

SUMMARY OF THE DISCLOSURE

The present disclosure is provided to solve the problems and therefore, the present disclosure provides an apparatus for cooling an inverter configured to optimize a heat radiation effect in response to flow of heat generated from internal elements of the inverter.

In one general aspect of the present disclosure, there is provided an apparatus for cooling an inverter, the apparatus comprising: 1. An apparatus for cooling an inverter, the apparatus comprising: a housing having an inlet at one side and an outlet at the other side; a first wall extended from the inlet to be adapted to divide an inner space of the housing; and a second wall extended from the outlet to be adapted to divide the inner space of the housing, wherein at least one electric element is disposed on a first flow part and a second flow part formed by the first wall.

In some exemplary embodiment of the present invention, the first flow part may be configured to form a path on which the inlet and the outlet are arranged on a straight line.

In some exemplary embodiment of the present invention, a first electric element having a largest heat value in at least one electric element may be disposed on the first flow part.

In some exemplary embodiment of the present invention, the apparatus may further comprise a guide so arranged at a bottom surface of the first electric element as to allow the first electric element to maintain a predetermined gap from a floor of the housing.

In some exemplary embodiment of the present invention, a slope connected to the floor of the housing may be formed at one side of the guide.

In some exemplary embodiment of the present invention, the apparatus may further comprise a cooling fan at least arranged at any one of the inlet and the outlet.

In some exemplary embodiment of the present invention, the cooling fan may be disposed on a path on which the inlet and the outlet are arranged on a straight line.

In some exemplary embodiment of the present invention, position of the second wall may be determined by position and size of the outlet.

In some exemplary embodiment of the present invention, at least one opening may be formed between the first and second walls.

In some exemplary embodiment of the present invention, the apparatus may further comprise a third wall arranged between the first and second walls to allow at least one opening to be formed.

In some exemplary embodiment of the present invention, the third wall may be perpendicularly arranged relative to the first and second walls.

In some exemplary embodiment of the present invention, the third wall may be arranged at a predetermined angle between the first and second walls.

In some exemplary embodiment of the present invention, at least one electric element may be arranged at a third flow part formed at a space where air is moved before air is discharged through the opening by the second wall.

In some exemplary embodiment of the present invention, the apparatus may further comprise a fourth wall extended from the inlet to be adapted to divide the inner space of the housing.

In some exemplary embodiment of the present invention, the second wall is arranged from the outlet at a predetermined gap.

In some exemplary embodiment of the present invention, the first wall may take a shape of a straight line.

In some exemplary embodiment of the present invention, the first wall may take a shape of a zigzag.

The apparatus for cooling inverter according to exemplary embodiments of the present disclosure has an advantageous effect in that air flow can be adjusted by separating a flow part in response to heat radiation amount of electric elements arranged inside a housing of a cooling apparatus, whereby an optimum heat radiation effect can be accomplished, and heat radiation can be optimized by arranging an opening near an outlet for adjusting flow amount and flow speed, and an optimized element arrangement can be accomplished by determination of discharge position in response to characteristics of electric element.

Another advantageous effect is that air flow can be controlled by using a wall configured to divide the flow part.

DETAILED DESCRIPTION

Hereinafter, various example embodiments of the present disclosure will be described in more detail with reference to the accompanying drawings. Thus, the disclosure described herein is intended to embrace all such alternatives, modifications, variations and applications as may fall within the spirit and scope of the appended claims.

Hereinafter, an apparatus for cooling inverter (hereinafter an apparatus for cooling inverter may be referred to as inverter cooling apparatus, or simply as apparatus) according to exemplary embodiments of the present disclosure will be described in detail with reference to the accompanying drawings.

Figure 1:
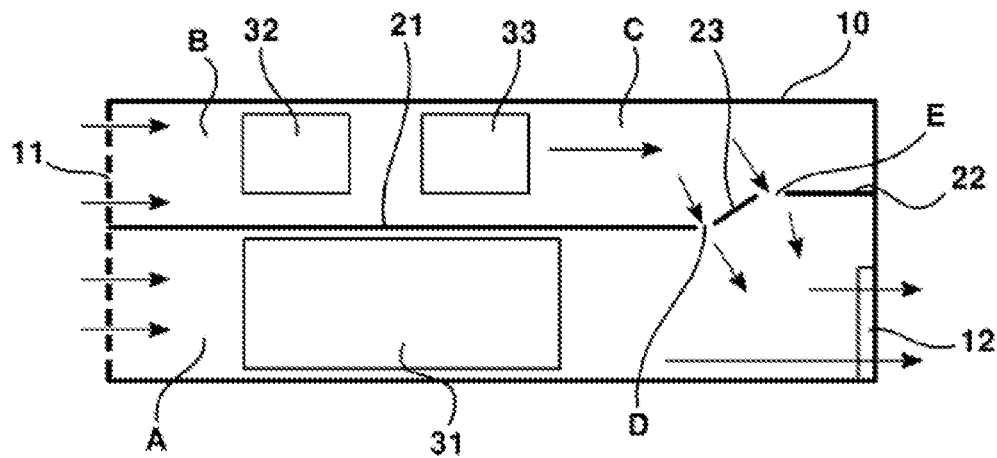
FIG. 1 is a schematic plan view illustrating a structure of an apparatus for cooling inverter according to a first exemplary embodiment of the present disclosure.

FIG. 1 is a schematic plan view illustrating a structure of an apparatus for cooling inverter according to a first exemplary embodiment of the present disclosure, where an interior of housing (10) is illustrated from an upper side.

Referring to FIG. 1, the apparatus is arranged inside a housing (10) of square shape, where an inlet (11) may be formed at one side of the housing (10) and an outlet (12) may be formed at the other side of the housing (10). That is, air introduced into the inlet (11) of the housing (10) may flow inside the housing (10) to cool electric elements and may be discharged out of the outlet (12).

The inlet (11) may be installed with a vent hole, for example, and the outlet (12) may be installed with a cooling fan. However, the present disclosure is not limited thereto. That is, the inlet (11) may be installed with a cooling fan and the outlet (12) may be formed with a vent hole. Alternatively, the inlet (11) and the outlet (12) may be respectively formed with a cooling fan to control the flow of air.

At this time, the vent hole is a air flow hole to allow air to be discharged to outside, and functions to introduce the air, and the cooling fan is a device using the air to discharge heat generated by the electric elements to the outside.

The housing (10) may be such that a first wall (21) is vertically extended from the inlet (11) to divide an interior of the housing (10) to a lengthwise direction. The first wall (21) may be extended from the inlet (11) to form a shorter length than that of the housing (10).

The first wall (21) may include a first flow part (A) and a second flow part (B) in which air flows.

Furthermore, the housing (10) may be such that a second wall (22) is extended from the outlet (12) to divide an interior of the housing (10) to a lengthwise direction. The position of the second wall (22) may be determined by position and size of the outlet (12). That is, unlike FIG. 1, if the position and size of the outlet (12) correspond to those of the first flow part (A), the first wall (21) and the second wall (22) may be formed on a straight line.

Furthermore, a third wall (23) connecting the first and second walls (21, 22) may be arranged to form openings (D, E) between the first and second walls (21, 22). Although the first exemplary embodiment has described the third wall (23), it should be apparent that a plurality of walls may be formed according to the number of openings (D, E) to be formed.

The first flow part (A) may be arranged with a first electric element (31), and the second flow part (B) may be arranged with second and third electric elements (32, 33). The electric element (31) arranged at the first flow part (A) may be an electric element that generates the greatest heat amount. For example, the first electric element (31) may be a heat sink. Furthermore, the electric elements (32, 33) arranged at the second flow part (B) may be electric elements that generate smaller heat amount. For example, the second and third electric elements (32, 33) may be respectively capacitor and a DCL (DC reactor). Although the exemplary embodiment has described two electric elements arranged on the second flow part (B), it should be apparent that the number is not limited and types and number of electric elements may be determined in consideration of various factors including sizes of electric elements and generated heat.

Figure 2A:
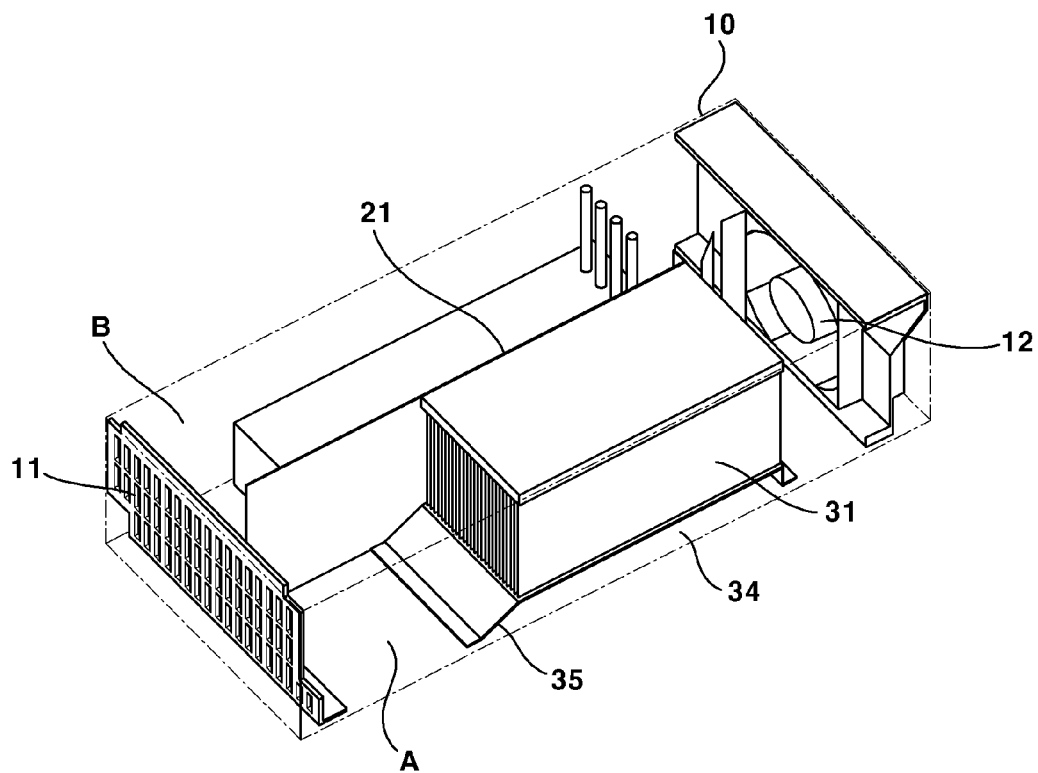
FIG. 2a is a schematic perspective view illustrating an apparatus for cooling inverter of FIG. 1.
Figure 2B:
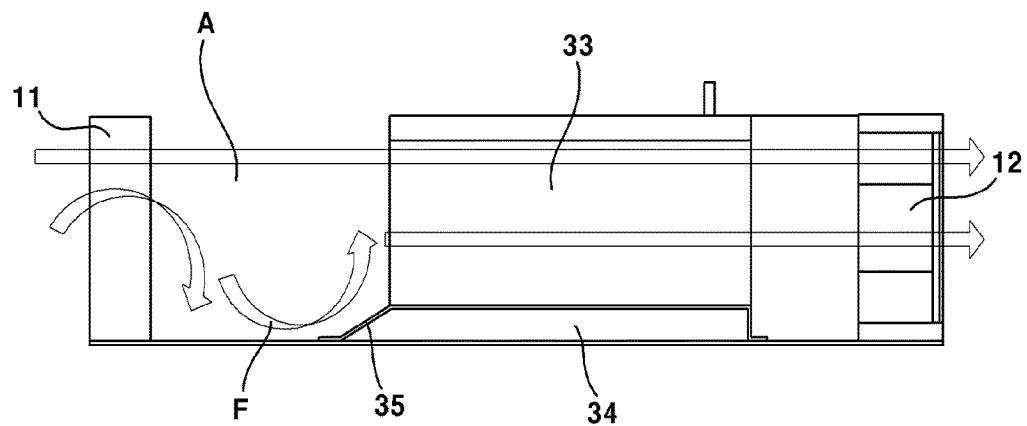
FIG. 2b is a lateral view.

FIG. 2a is a schematic perspective view illustrating an apparatus for cooling inverter of FIG. 1, and FIG. 2b is a lateral view.

Referring to FIGS. 2a and 2b, the first electric element (31) arranged on the first flow part (A) has a greater heat generation, and therefore may be arranged at an upper surface of a guide (34) to allow air to be introduced. The guide (34) may be so arranged at a bottom surface of the first electric element (31) as to allow the first electric element (31) to maintain a predetermined gap from a floor of the housing (10), and may be formed at one side with a slope (35) to allow air moving in the first flow part (A) to flow through (see F of FIG. 2b).

Now, operation of the apparatus will be described hereunder.

Referring FIGS. 1 and 2, air introduced through the inlet (11) of the housing (10) may be sucked into the first and second flow parts (A, B). The first wall (21) cross-wisely controls the flow of the air. The air flowing through the first and second flow parts (A, B) serves to cool the electric elements (31, 32) and is discharged to the outside through the outlet (12) arranged at the other side of the housing (10).

The first flow part (A) is formed with a straight path through which the air introduced from the inlet (11) can be discharged through the outlet (12), the path being a path where air flow is concentrated, such that the electric element (31) having a greater heat generation is preferably arranged at the first flow part (A). That is, the first flow part (A) arranged with the electric element (31) of greater heat generation is set with a shortest distance between air flow and discharge in order to maximize the heat radiation effect.

The second flow part (B) is so formed as to allow the air introduced from the inlet (11) to face the outlet (12) through the openings (D, E), where the air flows from a third flow part (C) through the second and third electric elements (32, 33) and is discharged to the outlet (12) through the openings (D, E). The size of the opening (D, E) may be determined in consideration of flow amount and speed as the flow is adjusted, and shape of the opening may take a shape of a hole or a surface.

That is, the first, second and third walls (21, 22, 23) may be integrally formed, and the openings (D, E) may be formed in the form of a hole thereamong, or the first, second and third walls (21, 22, 23) may be separately formed, and the openings (D, E) may be formed in the shape of a surface.

The apparatus according to the exemplary embodiment of the present disclosure as illustrated in FIGS. 1 and 2 has a structure in which the first and second flow parts (A, B) are cross-wisely positioned base on the inlet (11) and the outlet (12), and the apparatus is divided by a right side and a left side based on the inlet (11). However, the present disclosure is not limited thereto, and the first and second flow parts (A, B) may be divided to an upper part and a lower part. That is, electric elements may be arranged by rotating the structure of FIG. 1 by 90°.

Meantime, the air that has cooled the electric elements (32, 33) and has been discharged from the second flow part (B) may flow the third flow part (C) and may be discharged to the outlet (12) through the openings (D, E). The third flow part (C) in the exemplary embodiment of the present disclosure may be arranged with a fourth electric element (36).

Figure 3:
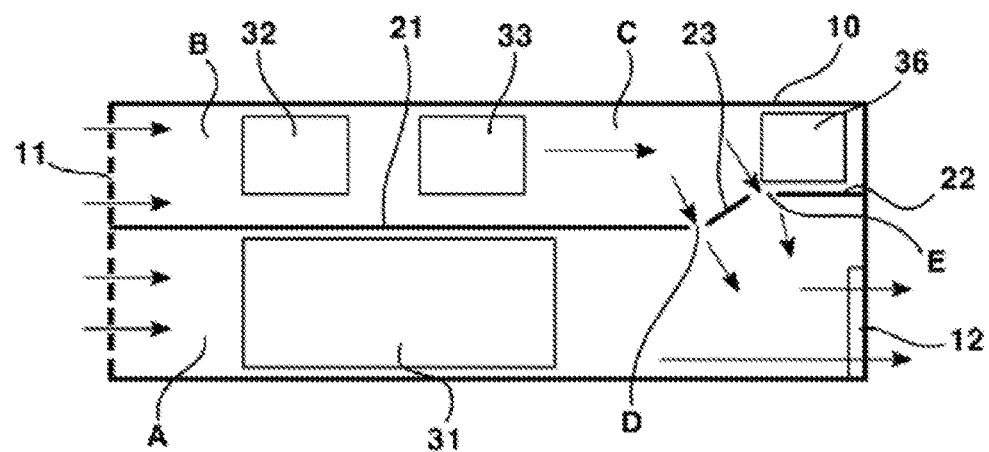
FIG. 3 is an exemplary view illustrating an arrangement of electric elements on a third flow part of FIG. 1.

FIG. 3 is an exemplary view illustrating an arrangement of electric elements on a third flow part of FIG. 1.

Referring to FIG. 3, the air discharged through the second flow part (B) flows in the third flow part (C) such that the electric element (36) may be arranged at the third flow part (C), whereby an inner space of the housing (10) can be maximally and efficiently used to reduce the size of the apparatus and to maximized the cooling performance.

Figure 4:
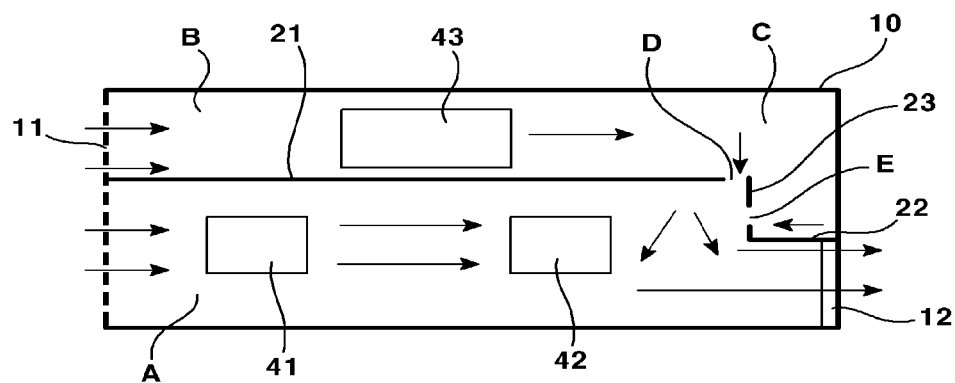
FIG. 4 is a schematic plan view illustrating a structure of an apparatus for cooling inverter method for controlling an inverter according to a second exemplary embodiment of the present disclosure.

FIG. 4 is a schematic plan view illustrating a structure of an apparatus for cooling inverter method for controlling an inverter according to a second exemplary embodiment of the present disclosure.

Referring to FIG. 4, the first and second flow parts (A, B) are arranged in consideration of the heat generation by the electric elements (41, 42, 43), where it shows a case where heat generation of electric elements (41, 42) arranged at the first flow part (A) on which the inlet and outlet (11, 12) are straightly arranged is greater than that of the electric element (43) arranged at the second flow part (B).

In the second exemplary embodiment of the present disclosure, the openings (D, E) may be formed in the same direction (E) and vertical direction (D) based on the direction of the outlet (12). That is, the third wall (23) may be vertically arranged relative to the first and second walls (21, 22), unlike in the first exemplary embodiment where a slope is formed. Other configuration is same as in the first exemplary embodiment such that no further elaboration will be made.

Figure 5:
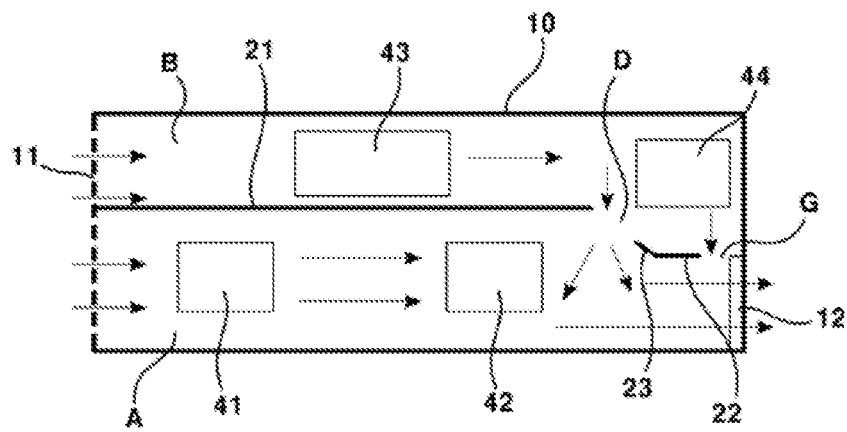
FIG. 5 is a schematic plan view illustrating a structure of an apparatus for cooling inverter method for controlling an inverter according to a third exemplary embodiment of the present disclosure.

FIG. 5 is a schematic plan view illustrating a structure of an apparatus for cooling inverter method for controlling an inverter according to a third exemplary embodiment of the present disclosure, where the second wall (22) may be extended and distanced at a predetermined distance from the housing (10) to form an opening (G), and the third wall (23) may contact the second wall (22) to be slantly formed toward the first wall (21). Furthermore, an electric element (44) may be arranged at the third flow part (C) according to the third exemplary embodiment as shown in FIG. 5. Under this configuration, the openings (D, G) may be arranged nearest to the outlet (22) to promote the maximum effect of heat radiation.

Figure 6:
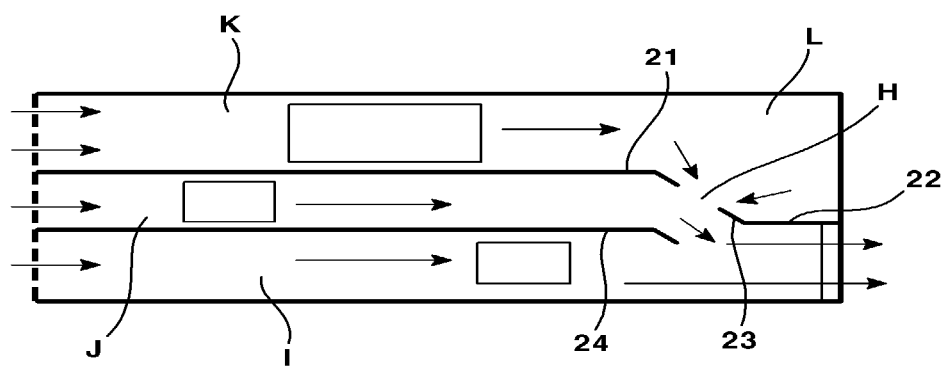
FIG. 6 is a schematic plan view illustrating a structure of an apparatus for cooling inverter method for controlling an inverter according to a fourth exemplary embodiment of the present disclosure.

FIG. 6 is a schematic plan view illustrating a structure of an apparatus for cooling inverter method for controlling an inverter according to a fourth exemplary embodiment of the present disclosure, where a fourth wall (24) may be arranged in parallel with the first wall (21) to form first to fourth flow parts (I, J, K, L).

According to the fourth exemplary embodiment of the present disclosure, a plurality of walls may be arranged to form a plurality of flow parts, and various structures may be formed according to the number of electric elements. However, the present disclosure is not limited to the number of walls defined in FIG. 6.

Figure 7:
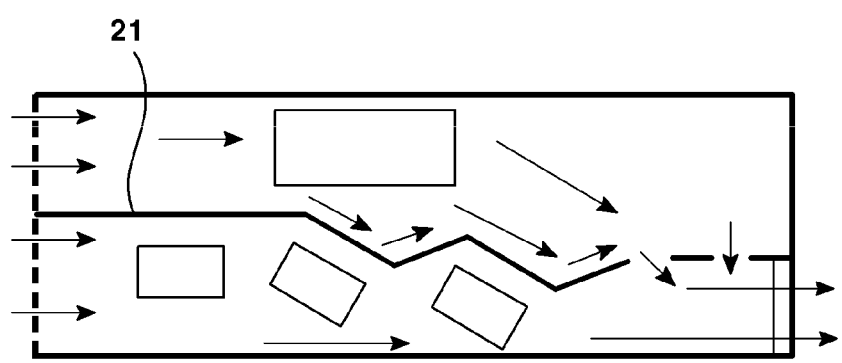
FIG. 7 is a schematic plan view illustrating a structure of an apparatus for cooling inverter method for controlling an inverter according to a fifth exemplary embodiment of the present disclosure.

FIG. 7 is a schematic plan view illustrating a structure of an apparatus for cooling inverter method for controlling an inverter according to a fifth exemplary embodiment of the present disclosure, where the first wall (21) is so configured as to allow air to be smoothly flowed. Although FIG. 7 has illustrated the first wall (21) in the shape of a zigzag, the present disclosure is not limited thereto, and various structures may be proposed in consideration of size of the outlet (12) and size of the housing (10).

Although the present disclosure has been described with reference to a number of illustrative embodiments thereof, it should be understood that numerous other modifications and embodiments can be devised by those skilled in the art that will fall within the spirit and scope of the principles of this disclosure.

More particularly, various variations and modifications are possible in the component parts and/or arrangements of subject combination arrangement within the scope of the disclosure, the drawings and the appended claims. In addition to variations and modifications in the component parts and/or arrangements, alternative uses will also be apparent to those skilled in the art.

What is claimed is:

1. An apparatus for cooling an inverter, the apparatus comprising:
   a housing having an air inlet at one side and an air outlet at the other side; and
   a wall dividing an inner space of the housing in order to form a first flow part and a second flow part to allow air introduced to the air inlet to be discharged through the air outlet,
   wherein:
   the wall includes a first wall starting from the air inlet, a second wall starting from the air outlet, and a third wall located between the first and second walls, an opening formed at least between the first wall and the third wall or between the second wall and the third wall;
   the first wall and the second wall are formed in parallel, but not formed on a straight line, such that the third wall is arranged slantly with a predetermined angle between one end of the first wall and one end of the second wall;
   the air outlet is formed only on the first flow part such that a housing surface is formed on the second flow part at the other side of the housing, a third flow part formed by the second wall and the housing surface;
   air introduced into the second flow part through the air inlet merges with the first flow part through the opening;
   at least one electric element is disposed on a corresponding one of the first, second, or third flow part; and
   the opening is arranged so as to functionally induce and allow the air in the second flow part to be discharged to the air outlet formed only at the first flow part.

2. The apparatus of claim 1, wherein the first flow part is configured to form a path on which the air inlet and the air outlet are arranged on a straight line.

3. The apparatus of claim 2, wherein a first electric element having a largest heat value in at least one electric element is disposed on the first flow part.

4. The apparatus of claim 3, further comprising:
   a guide arranged at a bottom surface of the first electric element so as to allow the first electric element to maintain a predetermined gap from a floor of the housing.

5. The apparatus of claim 4, wherein a slope connected to the floor of the housing is formed at one side of the guide.

6. The apparatus of claim 1, further comprising:
   a cooling fan at least arranged at any one of the air inlet and the air outlet.

7. The apparatus of claim 6, wherein the cooling fan is disposed on a path on which the air inlet and the air outlet are arranged on a straight line.

8. The apparatus of claim 1, wherein a position of the second wall is determined by a position and a size of the air outlet formed only on the first flow part.

9. The apparatus of claim 1, wherein the at least one electric element is arranged at the third flow part formed at a space where the air is moved before the air is discharged through the opening by the second wall.

10. The apparatus of claim 1, further comprising:
   a fourth wall extended from the air inlet to be adapted to divide the inner space of the housing.

11. The apparatus of claim 1, wherein the second wall is arranged from the air outlet at a predetermined gap.

12. The apparatus of claim 1, wherein the first wall takes a shape of a straight line.

13. The apparatus of claim 1, wherein the first wall takes a shape of a zigzag.

* * * * *